United States Patent
Cui et al.

(10) Patent No.: US 10,162,396 B2
(45) Date of Patent: Dec. 25, 2018

(54) METHOD AND SYSTEM FOR REMOVING HEAT USING HEAT REMOVAL LIQUID BASED ON WORKLOAD OF SERVER COMPONENTS OF ELECTRONIC RACKS

(71) Applicant: Baidu USA LLC, Sunnyvale, CA (US)

(72) Inventors: Yan Cui, San Jose, CA (US); Tianyi Gao, Santa Clara, CA (US); Charles J. Ingalz, San Jose, CA (US); Ali Heydari, Albany, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 15/490,239

(22) Filed: Apr. 18, 2017

(65) Prior Publication Data
US 2018/0299933 A1    Oct. 18, 2018

(51) Int. Cl.
*H05K 7/20* (2006.01)
*G06F 1/20* (2006.01)

(52) U.S. Cl.
CPC ......... *G06F 1/206* (2013.01); *H05K 7/20263* (2013.01); *H05K 7/20272* (2013.01); *H05K 7/20281* (2013.01); *H05K 7/20772* (2013.01)

(58) Field of Classification Search
CPC ........... H05K 7/20772; H05K 7/20281; H05K 7/20272; H05K 7/20263; G06F 1/206
USPC .................................................. 361/679.53
See application file for complete search history.

(56) References Cited

U.S. PATENT DOCUMENTS

| 5,323,847 | A  | * | 6/1994  | Koizumi  | H05K 7/20645 165/104.32 |
| 6,234,240 | B1 | * | 5/2001  | Cheon    | F28D 15/00 165/185 |
| 6,807,056 | B2 | * | 10/2004 | Kondo    | G06F 1/20 165/104.33 |
| 7,012,807 | B2 | * | 3/2006  | Chu      | G06F 1/20 165/104.33 |
| 7,310,737 | B2 | * | 12/2007 | Patel    | G06F 1/20 713/300 |
| 7,333,334 | B2 | * | 2/2008  | Yamatani | G06F 1/20 165/122 |
| 7,715,194 | B2 | * | 5/2010  | Brewer   | G06F 1/20 165/80.3 |
| 7,724,524 | B1 | * | 5/2010  | Campbell | H05K 7/20772 165/104.19 |

(Continued)

*Primary Examiner* — Anatoly Vortman
(74) *Attorney, Agent, or Firm* — Womble Bond Dickinson (US) LLP

(57) ABSTRACT

A liquid control architecture is designed to control a liquid flow rate based on the workload of the IT components of an electronic rack, which provides sufficient cooling capability to each IT component, saving a total cost of pump energy. A coolant distribution unit (CDU) is included in each electronic rack to pump a liquid flow to a liquid supply manifold of the electronic rack. Each outlet on the supply manifold provides heat removal liquid to each IT component (e.g., one or more GPUs of a server blade) using flexible tubing. The liquid heat removal system utilizes the workload of each IT component to drive the CDU pump speed. In addition, the temperature of the IT components rather than return liquid temperature is utilized as a baseline to monitor the temperature of the electronic rack and change the control logic (e.g., liquid flow rate) as needed.

15 Claims, 7 Drawing Sheets

(56) References Cited

U.S. PATENT DOCUMENTS

| | | | | |
|---|---|---|---|---|
| 7,885,070 B2* | 2/2011 | Campbell | ........... | H05K 7/20809 |
| | | | | 165/80.4 |
| 7,905,096 B1* | 3/2011 | Campbell | ........... | H05K 7/20836 |
| | | | | 62/259.2 |
| 7,991,515 B2* | 8/2011 | Lyon | ............ | G06F 1/206 |
| | | | | 700/300 |
| 8,240,165 B2* | 8/2012 | Novotny | ............ | F28D 15/00 |
| | | | | 165/103 |
| 8,654,532 B2* | 2/2014 | Chen | ............ | H05K 7/20781 |
| | | | | 137/247 |

\* cited by examiner

US 10,162,396 B2

METHOD AND SYSTEM FOR REMOVING HEAT USING HEAT REMOVAL LIQUID BASED ON WORKLOAD OF SERVER COMPONENTS OF ELECTRONIC RACKS

FIELD OF THE INVENTION

Embodiments of the present invention relate generally to data centers. More particularly, embodiments of the invention relate to removing heat generated by information technology (IT) components using heat removal liquid based on the workload of the IT components of an electronic rack.

BACKGROUND

Heat removal is a prominent factor in a computer system and data center design. The number of IT components such as servers deployed within a data center has steadily increased as the server performance has improved, thereby increasing the amount of heat generated during the ordinary operation of the servers. The reliability of servers used within a data center decreases if the environment in which they operate is permitted to increase in temperature over time. A significant portion of the data center's power is used for thermal management of electronics at the server level.

Recent trends in computing show a trend toward higher power density. As the number of servers within a data center increases, a greater portion of the power is commensurately consumed by the data center to remove heat from electronic components within the servers. Liquid heat removal offers a solution for higher power computing racks due to the relatively higher heat capacity and greater energy efficiency possible with liquid heat removal.

Direct-to-chip liquid cooling provides a cooling solution for power-intensive processors such as central processing unit (CPU) chips and general processing unit (GPU) cards. It has the advantage of a better heat exchange efficiency and a better chip cooling performance. Also it enables the possibility of increasing server/rack power density, while keeping lower power utilization effectiveness (PUE) than a conventional air cooling solution.

A solution structure of liquid cooling includes a primary loop and a secondary loop. The primary loop provides chilled liquid to a coolant distribution unit (CDU) and return the hot liquid back. The secondary loop cycles isolated liquid to cool the processor chip. The CDU has the function of heat exchange between two loops via heat exchanger, and provides the secondary loop's liquid flow through the pump within it.

Currently, a CDU is designed with either a fixed pump speed providing constant flow rate or controlled via liquid temperature difference on the secondary loop. A CDU pump with constant speed lacks a flexibility of providing variable liquid flow, and hence wastes pumping energy in the system. A CDU with temperature difference feedback control saves partial pumping energy, but due to the slow dynamic response of the liquid system and potential non-uniform distribution of a liquid flow to each GPU cold plate, this feedback logic is insufficient dealing with an extreme condition that one or more GPU cards are running at extreme workload while others in the same rack are running at relative low workload.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
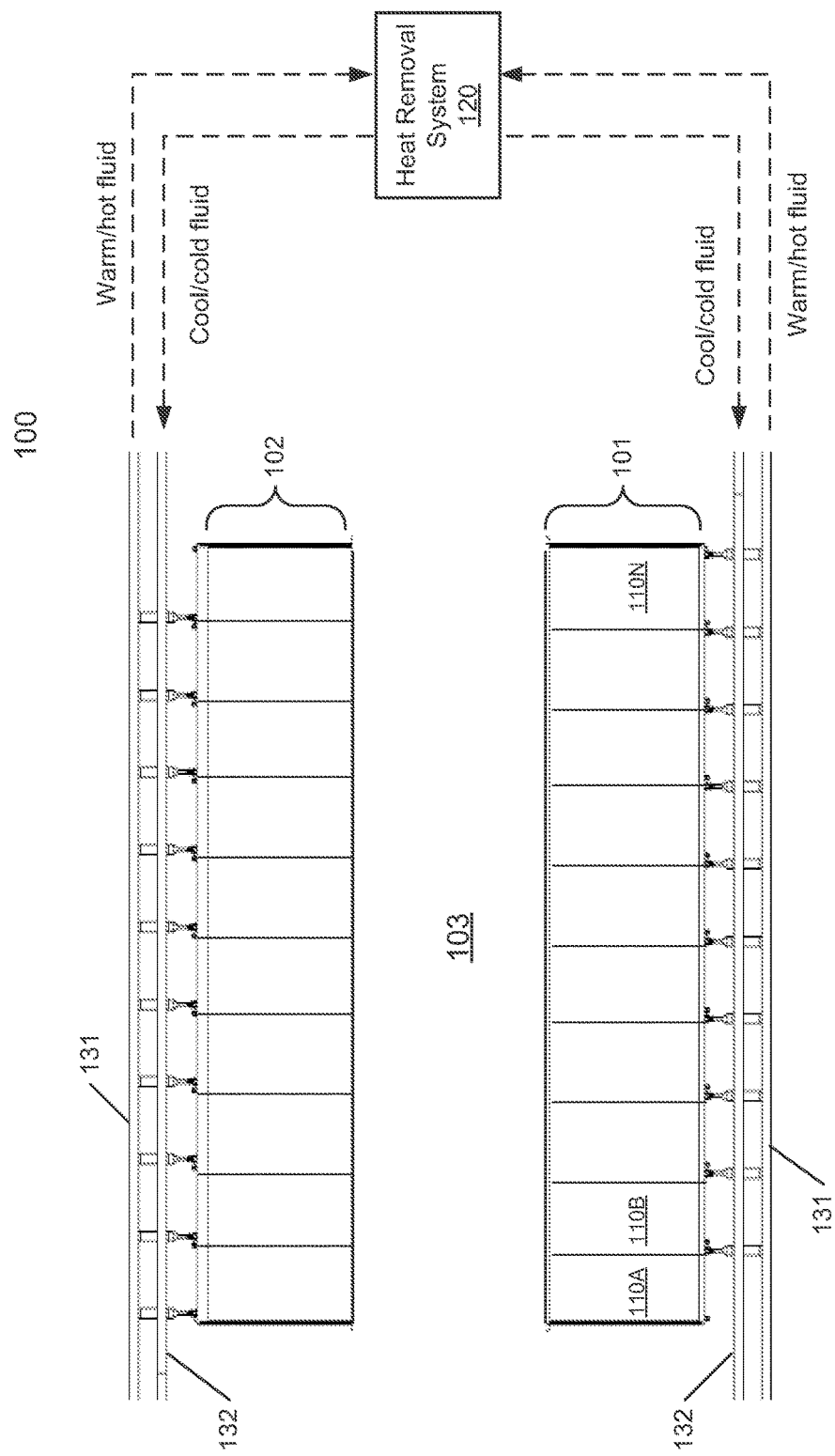
FIG. 1 is a block diagram illustrating a data center system according to one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a novel liquid control architecture is designed to control a liquid flow rate based on the workload of the IT components of an electronic rack. Such architecture is critical to provide sufficient cooling capability to each IT component and to save the total cost of pump energy. In this liquid cooling architecture, a CDU is included for each electronic rack, pumping liquid flow to a liquid supply manifold of the electronic rack. Each outlet on the supply manifold provides heat removal liquid to each IT component (e.g., one or more GPUs of a server blade) using flexible tubing and quick release connectors. The liquid heat removal system utilizes the workload of each IT component to drive the CDU pump speed. In addition, the temperature of the IT components rather than return liquid temperature is utilized as a baseline to monitor the temperature of the electronic rack and change the control logic (e.g., liquid flow rate) as needed.

Embodiments of the invention provide a new solution of using GPU card's workload to control the CDU's pump speed, and use GPU card's temperature as feedback to assist controlling the pump speed. In this electronic rack design, the GPU card's workload (e.g., compute node's workload) is distributed by the server with CPU (e.g., a master node or host), and hence in this solution, the CPU communicates with pump speed controller and provides workload information (e.g., power requirement) to the pump controller that controls the speed of a liquid pump. In this case, since the workload is delivered to pump controller prior to distributing the tasks or workload to the GPUs (e.g., a few seconds prior to task distribution), the pump controller can react by modifying the liquid flow rate before the GPU's power increases due to performing the distributed tasks. This configuration can reduce the possibility of any temperature overshoot after the GPU chip is boosted.

According to one aspect of the invention, an electronic rack includes a heat removal liquid manifold, a number of server blades contained in a number of server blade slots respectively, and a coolant distribution unit (CDU). The heat removal liquid manifold is to provide heat removal liquid to each of the server blades. Each of the sever blades is to receive heat removal liquid from the heat removal liquid manifold, to remove at least a portion of the heat generated by an IT component of the server blade using the heat removal liquid manifold, and to transmit warmer liquid carrying the heat exchanged from the IT component back to the heat removal liquid manifold. The CDU is configured to receive data representing a workload of the IT components of the server blades and to control a liquid flow rate of the heat removal liquid supplied to the heat removal liquid manifold based on the workload of the IT components of the server blades.

In one embodiment, a CDU includes a heat exchanger, a liquid pump, and a pump controller. The heat exchanger is a liquid-liquid heat exchanger to exchange heat carried by the warmer liquid with an external cooler liquid supplied by an external heat removal system. The liquid pump is configured to pump the cooler liquid into the heat removal liquid manifold from the heat exchanger and to pump the warmer liquid into heat exchanger from the heat removal liquid manifold. The pump controller is configured to control the speed of the liquid pump based on the workload of the IT components to control the liquid flow rate.

According to another aspect of the invention, an electronic rack further includes a rack management unit (RMU) having a rack management controller (RMC) and a workload calculator or calculation module. The RMC is coupled to each of the server blades to receive temperature information concerning an operating temperature of the IT components. The workload calculator is coupled to each of the server blades to receive workload information concerning the workload of the corresponding server blade. The workload calculator is configured to calculate a total workload that is about to be incurred by the server blades. The total workload information is then provided to the RMC. The RMC is then configured to generate a pump control command to the pump controller of the CDU to control the speed of the liquid pump, which in turn controls the liquid flow rate of heat removal liquid supplied to the liquid manifold.

In addition, based on the temperature information concerning the operating temperature of the IT components (e.g., the operating temperature of the CPUs and/or GPUs), RMC can periodically instruct the pump controller to adjust the speed of the liquid pump. For example, if the temperature is above a first predetermined threshold (e.g., an upper boundary), the RMC may instruct the pump controller to increase the speed of the liquid pump to increase the liquid flow rate of the heat removal liquid. If the temperature is below a second predetermined threshold (e.g., a lower boundary), the RMC may instruct the pump controller to decrease the speed of the liquid pump to save the energy consumed by the liquid pump.

According to another aspect of the invention, the server blades may include one or more host server blades and each host server blade is associated with one or more compute server blades. The host server blade represents a host server or a host node (e.g., a master server or master node) having one or more CPUs. Each of the compute server blades represents a compute node having one or more GPUs. The host node is configured to determine and distribute tasks such as data processing tasks to each of the compute nodes. The workload may be represented by an amount of power (e.g., in wattages) the compute nodes may consume while performing the distributed tasks. In one embodiment, prior to distributing the tasks to compute nodes, the host node estimates the workload for the compute nodes and sends the workload information concerning the workload to workload calculator. In response, the workload calculator is configured to calculate the total workload of compute nodes and communicate with the CDU to configure the liquid pump to modify a liquid flow rate of the heat removal liquid to generate sufficient cooling liquid volume in the liquid manifold. Thereafter, the host node then distributes the tasks to the compute nodes to perform the tasks to ensure that the compute nodes operate in a proper temperature controlled operating environment.

During the operations of performing the data processing tasks, the temperatures of the compute nodes are actively monitored and the liquid flow rate of the heat removal liquid is dynamically adjusted as needed. That is, the process includes two phase: 1) initial liquid flow rate adjustment phase based on the workload distribution prior to the actual task distribution and 2) dynamic liquid flow rate adjustment phase based on the actual temperatures of the IT components during the task performance. A data center system may include an array of electronic tracks and each of the electronic racks includes a liquid heat removal system as described above.

FIG. 1 is a block diagram illustrating a data center system according to one embodiment of the invention. In this example, FIG. 1 shows a top view of at least a portion of a data center. Referring to FIG. 1, according to one embodiment, data center system 100 includes rows of electronic racks of IT components, equipment or instruments 101-102, such as, for example, computer servers that provide data services to a variety of clients. In this embodiment, data center system 100 includes electronic racks, such as electronic racks 110A-110N, arranged in row 101 and row 102. However, more or fewer rows of electronic racks may be implemented. Typically, rows 101-102 are aligned in parallel with frontends facing each other and backends facing away from each other, forming aisle 103 in between to allow an administrative person walking therein. However, other configurations or arrangements may also be applied.

In one embodiment, each of the electronic racks (e.g., electronic racks 110A-110N) includes a back panel, a number of server slots, and a number of server blades capable of being inserted into and removed from the server slots. Each server blade includes a processor (e.g., CPU or GPU), a memory, and/or a persistent storage device (e.g., hard disk), which represents a computer server. The back panel is disposed on a backend of the electronic rack. The back panel includes a heat removal liquid manifold assembly to provide heat removal liquid from an external heat removal system 120 to remove heat from the server blades. Each server blade can be inserted and removed from a corresponding server slot from a frontend of the electronic rack. Heat removal system 120 may be a chiller system with an active refrigeration cycle. Alternatively, heat removal system 120 can include but not limited to evaporative cooling, free air, rejection to large thermal mass, and waste heat recovery designs.

In one embodiment, each of the electronic racks in rows 101-102 includes a heat removal liquid manifold, a number of server blades contained in a number of server blade slots respectively, and a coolant distribution unit (CDU). The heat removal liquid manifold is to provide heat removal liquid to each of the server blades. Each of the sever blades is to receive heat removal liquid from the heat removal liquid manifold, to remove at least a portion of the heat generated by an IT component of the server blade using the heat removal liquid manifold, and to transmit warmer liquid carrying the heat exchanged from the IT component back to the heat removal liquid manifold. The CDU is configured to receive data representing a workload of the IT components of the server blades and to control a liquid flow rate of the heat removal liquid supplied to the heat removal liquid manifold based on the workload of the IT components of the server blades.

The heat removal liquid manifold disposed on the backend of each electronic rack is coupled to liquid supply line 132 to receive heat removal liquid from heat removal system 120. The heat removal liquid is to remove heat from the IT component. The resulting warmer or hotter liquid carrying the heat exchanged from the IT component is transmitted via supply line 131 back to heat removal system 120. Liquid supply lines 131-132 are referred to as data center liquid supply lines (e.g., global liquid supply lines), which supply heat removal liquid to all of the electronic racks of rows 101-102.

Figure 2:
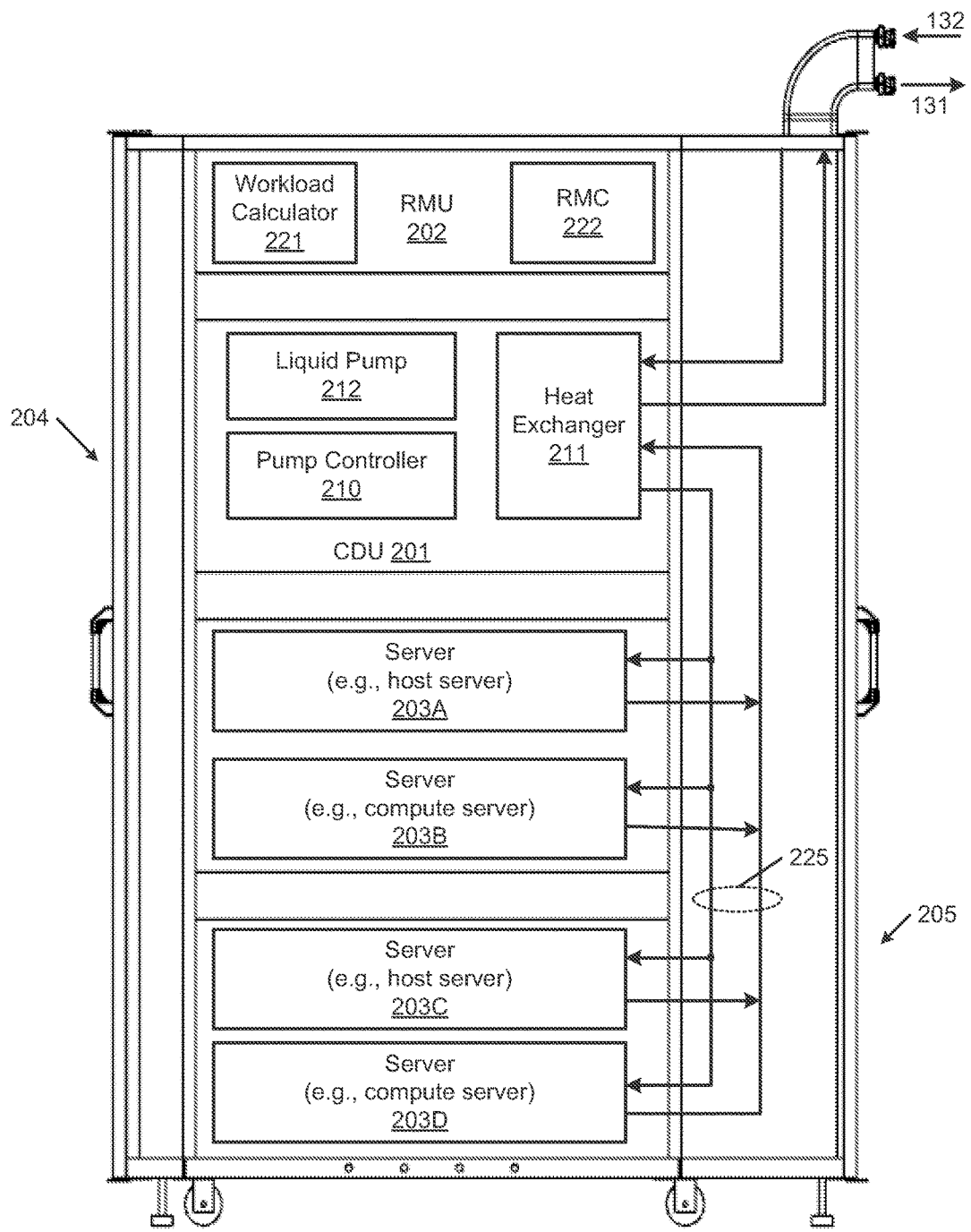
FIG. 2 is a block diagram illustrating an example of an electronic rack according to one embodiment of the invention.

FIG. 2 is a block diagram illustrating a side view of an electronic rack according to one embodiment of the invention. Electronic rack 200 may represent any of the electronic racks of rows 101-102 of FIG. 1 such as electronic racks 110A-110N. Referring to FIG. 2, in one embodiment, electronic rack 200 includes CDU 201, RMU 202, and one or more server blades 203A-203D, collectively referred to as server blades 203. Sever blades 203 can be inserted into an array of server slots respectively from frontend 204 of electronic rack 200. Note that although there are only four server blades 203A-203D shown in FIG. 2, more or fewer server blades may be maintained within electronic rack 200. Also note that the particular positions of CDU 201, CMU 202, and server blades 203 are shown for the purpose of illustration only; other arrangements or configurations of CDU 201, CMU 202, and server blades 203 may also be implemented. Further, the front door disposed on frontend 204 and the back door disposed on backend 205 are optional. In some situations, there may no door on frontend 204 and/or backend 205.

In one embodiment, CDU 201 includes heat exchanger 211, liquid pump 212, and pump controller 210. Heat exchanger 211 may be a liquid-to-liquid heat exchanger. Heat exchanger 211 includes a first tube having a first pair of liquid connectors coupled to external liquid supply lines 131-132 to form a primary loop, where the connectors coupled to the external liquid supply lines 131-132 may be disposed or mounted on backend 205 of electronic rack 200. In addition, heat exchanger 211 further includes a second tube having a second pair of liquid connectors coupled to liquid manifold 225, which may include a supply manifold to supply cooling liquid to server blades 203 and a return manifold to return warmer liquid back to CDU 201 (not shown).

Each of server blades 203 may include one or more IT components (e.g., CPUs, GPUs, memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which may generate heat during the operations.

Electronic rack 200 further includes RMU 202 configured to provide and manage power supplied to server blades 203 and CDU 201. RMU 202 may be coupled to a power supply unit (not shown) to manage the power consumption of the power supply unit, as well as other thermal management of the power supply unit (e.g., cooling fans). The power supply unit may include the necessary circuitry (e.g., an alternating current (AC) to direct current (DC) or DC to DC power converter, battery, transformer, or regulator, etc.,) to provide power to the rest of the components of electronic rack 200.

In one embodiment, RMU 202 includes workload calculator or calculation module 221 and RMC 222. Workload calculator 221 is coupled to at least some of server blades 203 to receive workload information representing the workload of the server blades and to calculate the total workload of the server blades. Based on the total workload, RMC 222 is configured to send a signal or data to pump controller 210 of CDU 201, where the signal or data indicates the required workload of the server blades 203. Based on the workload of server blades 203, pump controller 210 controls the speed of liquid pump 212, which in turn controls the liquid flow rate of heat removal liquid supplied to the liquid manifold to be distributed to at least some of server blades 203.

Specifically, according to one embodiment, workload calculator 221 is coupled to each of the host servers to receive workload information from the host servers that distribute the tasks to one or more compute servers. The workload information may include information indicating the power (e.g., wattages) the compute servers will likely consume while performing the tasks. In one embodiment, the host servers communicate the workload information to workload calculator 221 prior to distributing the tasks to compute servers, such that the liquid flow rate is adjusted prior to the temperatures of the compute servers rise.

In addition, according to another embodiment, RMC 222 is also coupled to at least the compute servers to periodically or constantly monitor the operating temperatures of the compute servers and to dynamically further adjust the liquid flow rate of the heat removal liquid based on the operating temperatures. Each of the compute servers may include a thermal sensor to sense the operating temperature of one or more processors of the compute server. The thermal sensor may be directly attached to a body of the processor or a heat sink attached to the processor. Thus, the temperature measured directly represents the temperature of the processor instead of the ambient temperature of the operating environment surrounding the server. The liquid flow rate of the heat removal liquid is adjusted based on the temperature of the processors, instead of the ambient temperature or the temperature of the return liquid.

Figure 3:
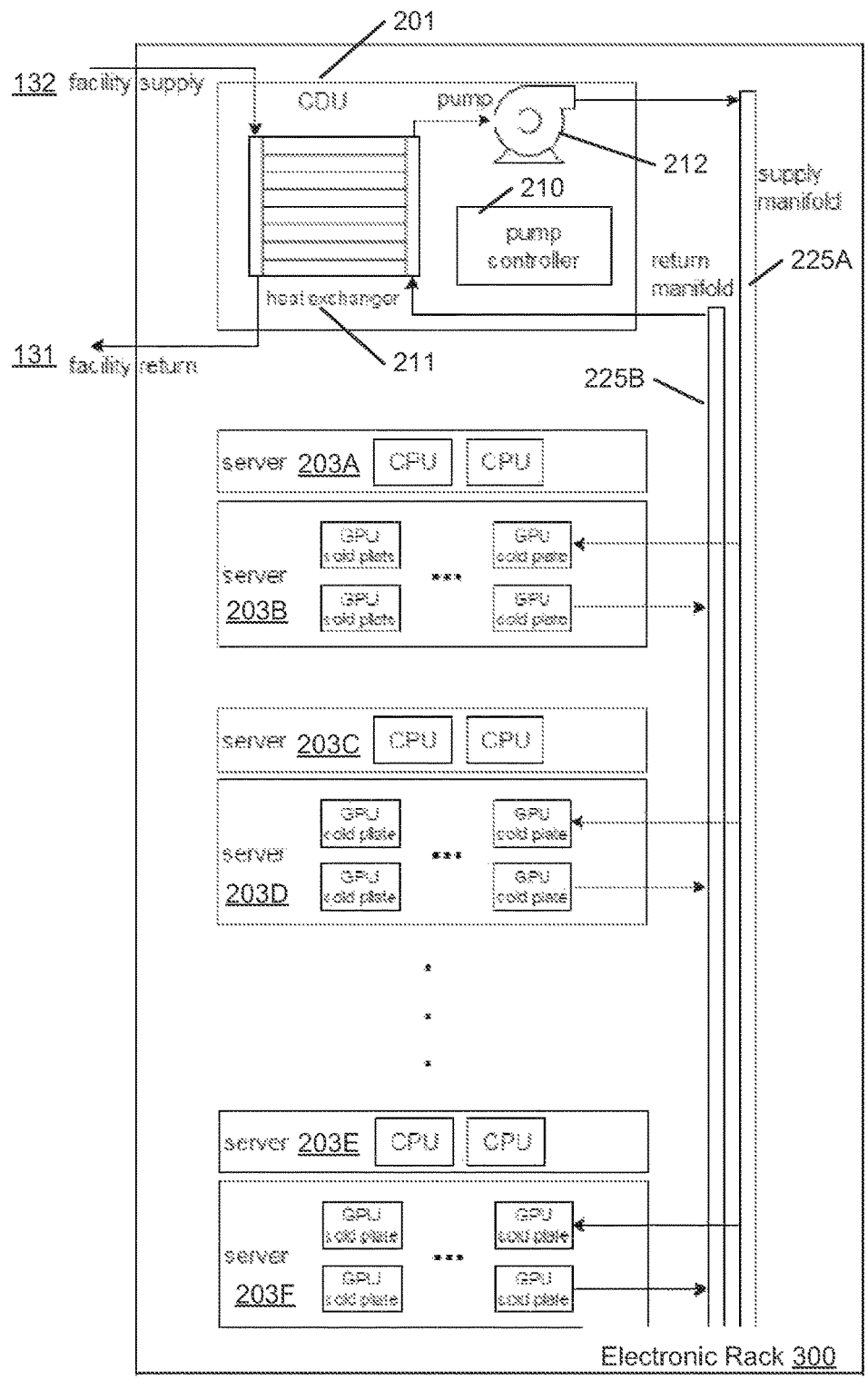
FIG. 3 is a block diagram illustrating an example of an electronic rack according to another embodiment of the invention.

FIG. 3 is a block diagram illustrating an example of an electronic rack according to another embodiment of the invention. Referring to FIG. 3, electronic rack 300 includes a number of servers 203A-203F and each of servers 203A-203F may be inserted into one of the server slots of electronic rack 300. In this example, servers 203A, 203C, and 203E are implemented as host servers, while servers 203B, 203D, and 203F are compute servers coupled to servers 203A, 203C, and 203E respectively. Servers 203A, 203C, and 203E distribute tasks to be performed by servers 203B, 203D, and 203F. Thus, most of the heat will be generated by the processors of servers 203B, 203D, and 203F.

Each of the processors, in this example, GPUs of servers 203B, 203D, and 203F may be attached to a liquid cold plate, where the liquid cold plate removes at least a portion of the heat generated by the processor. Typically, a liquid cold plate is integrated with or attached to a heat sink, where the liquid cold plate includes a liquid distribution channel embedded or attached therein to allow the cooling liquid to flow therein to exchange the heat generated from the processor and carried by the heat sink. The liquid distribution channel is then coupled to liquid supply manifold 225A and liquid return manifold 225B.

CDU 201 includes heat exchanger 211 coupled to external liquid supply line 132 and liquid return line 131 to form a primary loop. Heat exchanger 211 is further coupled to liquid pump 212, liquid supply manifold 225A, and liquid return manifold 225B to form a secondary loop. Liquid pump 212 is controlled by pump controller 210. In one embodiment pump controller 210 controls the speed of liquid pump 212 based on the workload associated with at least compute servers 203B, 203D, and 203F. The workload of servers 203B, 203D, and 203F may be calculated by a workload calculator (not shown) based on the estimated workload of servers 203B, 203D, and 203F. The workload of servers 203B, 203D, and 203F may be estimated by host servers 203A, 203C, and 203E respectively.

In addition, pump controller 210 further controls and adjusts the speed of liquid pump 212 based on the temperatures of servers 203B, 203D, and 203F, especially based on the temperatures of GPUs of servers 203B, 203D, and 203F. The temperature of a processor may be sensed and monitored using a temperature sensor such as a thermostat attached to the processor or its heat sink or liquid cold plate. Therefore, in this configuration, liquid pump 212 is able to provide variable cooling capacity to the processors of servers 203B, 203D, and 203F. The controlling of the speed of liquid pump 212 based on the workload can provide precise temperature control of the processors.

Figure 4:
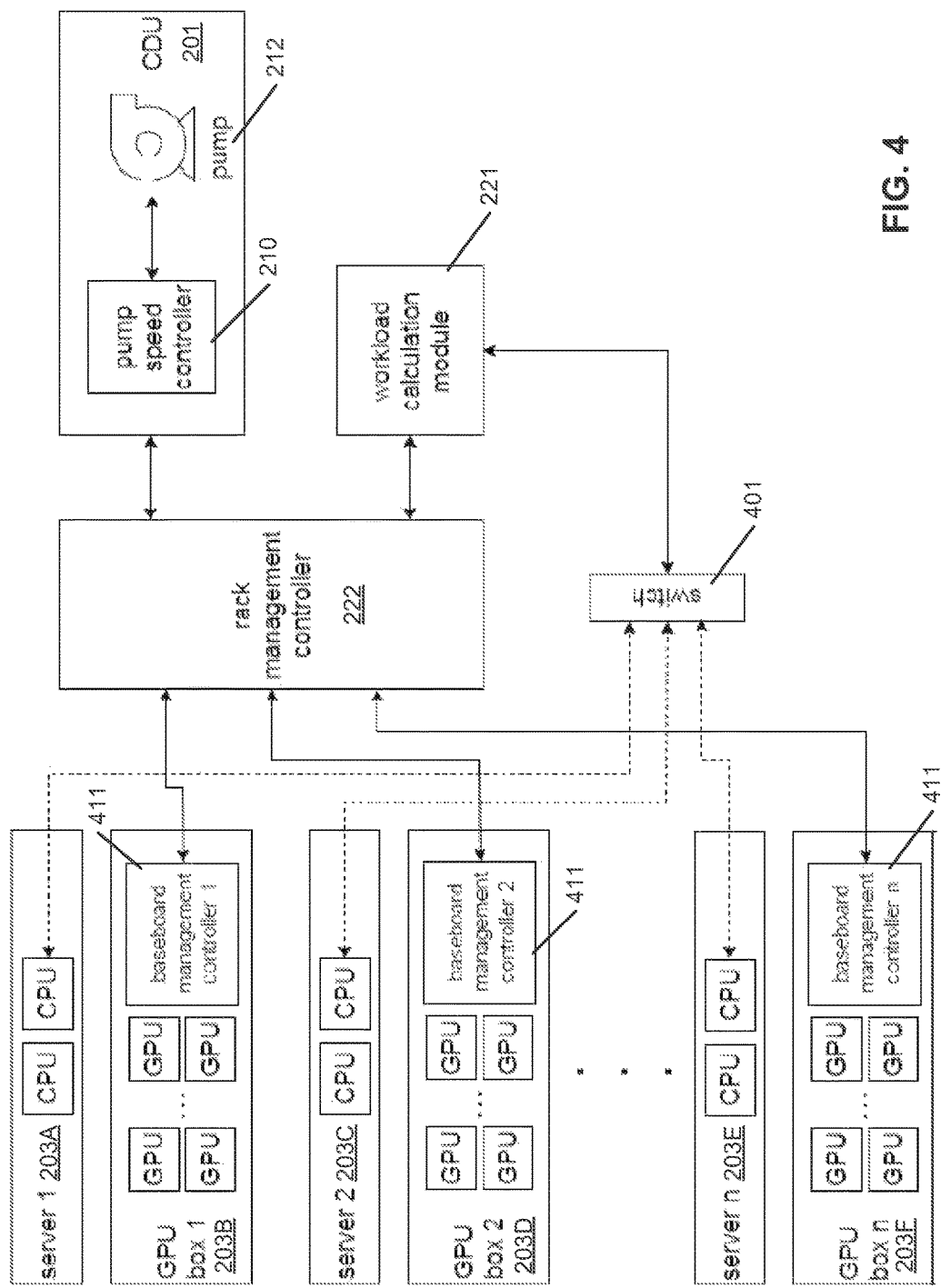
FIG. 4 is a block diagram illustrating an example of an electronic rack according to another embodiment of the invention.

FIG. 4 is a block diagram illustrating an example of an electronic rack according to another embodiment of the invention. Referring to FIG. 4, in this embodiment, RMC 222 is coupled to baseboard management controllers (BMCs) 411-413 of compute servers 203B, 203D, and 203F to obtain the operating temperature information of the processors within compute servers 203B, 203D, and 203F. A BMC is configured to manage and monitor the operations of the processors on the same server blade, including sensing and monitoring the operating temperature of the processors. In addition, workload calculator 221 is coupled to each of host servers 203A, 203C, and 203E to obtain the workload information via an optional switch 401. As described above, each of host servers 203A, 203C, and 203E includes a power management module (not shown), which may be a piece of software module executed by a CPU. The power management module may estimate the potential power a compute server blade consumes in view of the tasks to be distributed.

The power management module estimates the power and time that are required for the compute servers to perform the tasks to be distributed. The information concerning the required power is then communicated to workload calculator 221. In response, workload calculator 221 calculates the maximum power and time for the workload and sends the workload information to RMC 222. RMC 222 in turn sends commands to pump controller 210 to control the speed of liquid pump 212 of CDU 201.

In addition, RMC 222 receives temperature information of the processors of servers 203B, 203D, and 203F from their respective BMCs 411-413. RMC 222 then sends necessary signals to pump controller 210 to adjust the speed of liquid pump 212 based on the operating temperatures of the processors of servers 203B, 203D, and 203F. Pump controller 210 then applies a control signal to liquid pump to control the liquid flow rate in the liquid manifold of the electronic rack. For example, if the temperature is above a first predetermined threshold (e.g., an upper boundary), the RMC may instruct the pump controller to increase the speed of the liquid pump to increase the liquid flow rate of the heat removal liquid. If the temperature is below a second predetermined threshold (e.g., a lower boundary), the RMC may instruct the pump controller to decrease the speed of the liquid pump to reduce the energy consumption of the liquid pump.

Figure 5:
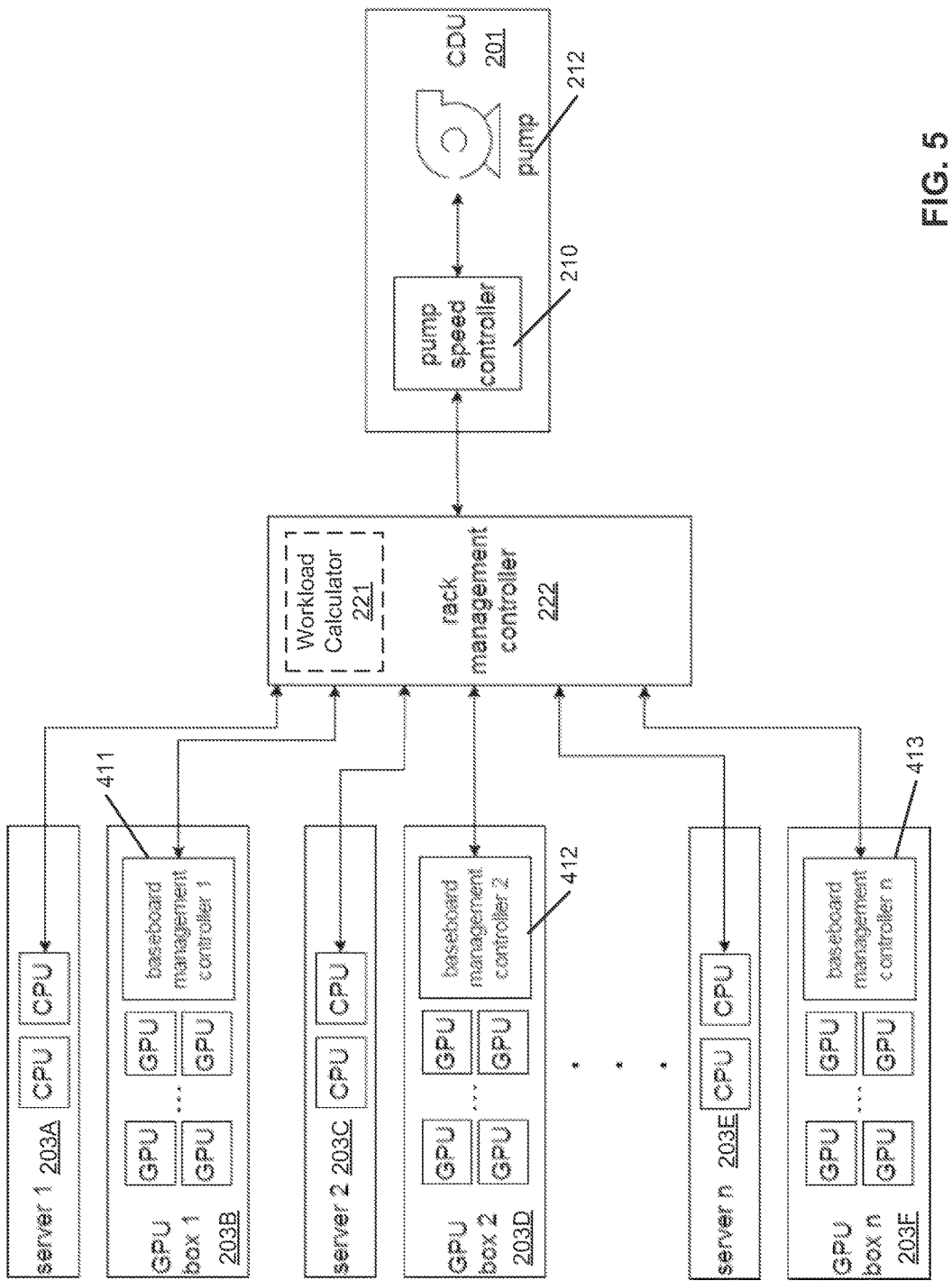
FIG. 5 is a block diagram illustrating an example of an electronic rack according to another embodiment of the invention.

FIG. 5 is a block diagram illustrating an example of an electronic rack according to an alternative embodiment of the invention. Referring to FIG. 5, in this embodiment, RMC 222 is coupled to each of servers 203A-203F to obtain both the workload information and the temperature information from servers 203A-203F. In this example, RMC 222 may include the functionality of workload calculator 221 or alternatively, workload calculator 221 may be integrated or included within RMC 222.

Figure 6:
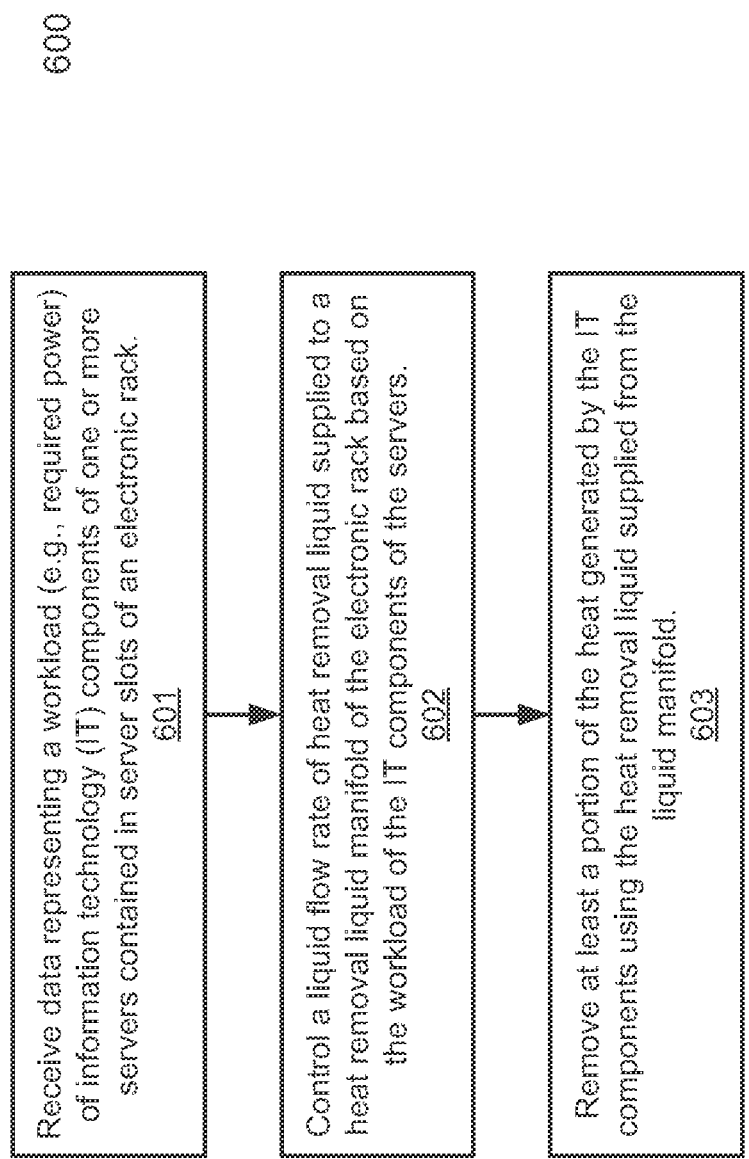
FIG. 6 is a flow diagram illustrating a process of thermal management of an electronic rack according to one embodiment of the invention.

FIG. 6 is a flow diagram illustrating a process of thermal management of an electronic rack according to one embodiment of the invention. Process 600 may be performed by processing logic which may include software, hardware, or a combination thereof. Referring to FIG. 6, in operation 601, processing logic receives data representing a workload of one or more IT components of one or more servers contained in sever slots of an electronic rack. In operation 601, processing logic controls a liquid flow rate of a heat removal liquid supplied to a liquid manifold of the electronic rack based on the workload of the IT components. In operation 603, processing logic removes at least a portion of the heat generated by the IT components using the heat removal liquid supplied through the liquid manifold. Each of the servers receives cooler liquid from the liquid manifold, removes at least a portion of the heat of the corresponding IT components, and returns the warmer liquid back to the liquid manifold carrying the heat exchanged from the IT components.

Figure 7:
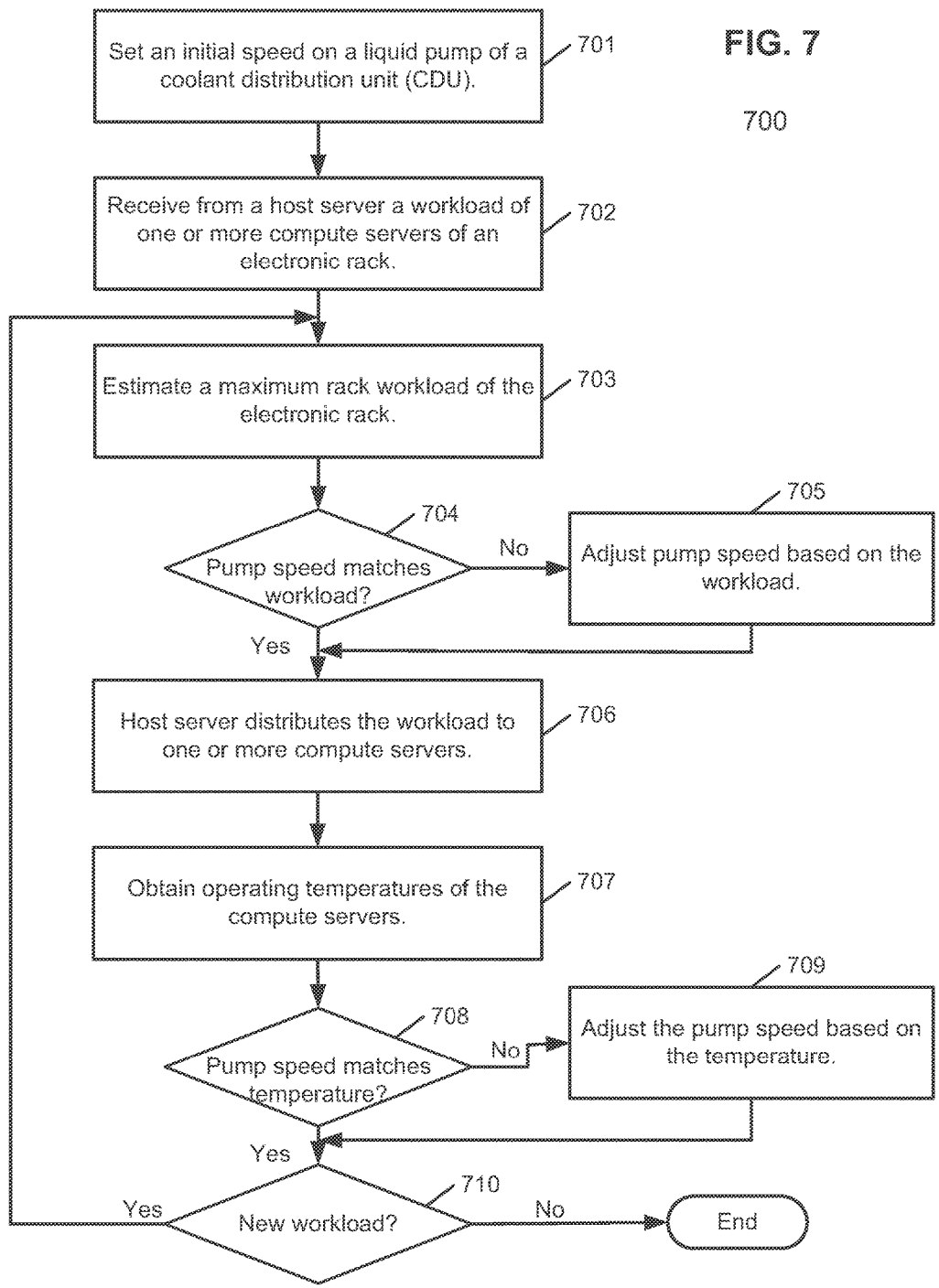
FIG. 7 is a flow diagram illustrating a process of thermal management of an electronic rack according to another embodiment of the invention.

FIG. 7 is a flow diagram illustrating a process of thermal management of an electronic rack according to another embodiment of the invention. Process 700 may be performed by processing logic which may include software, hardware, or a combination thereof. Referring to FIG. 7, in operation 701, the speed of a liquid pump of a CDU is set to an initial speed. In operation 702, processing logic communicates with each of the host servers to obtain the workload information concerning the workload of their associated compute server(s). In operation 703, processing logic estimates a maximum workload (e.g., required power) the compute servers will likely consume.

Note that different compute servers may have different workloads. In one embodiment, processing logic selects the workload of a compute server having the highest workload amongst all and multiplies the selected workload with a number of compute servers in the electronic rack to determine the maximum workload to be incurred by all of the compute servers of the electronic rack. Such an approach can ensure that the cooling liquid flow rate is sufficient to cover the worst scenario in terms of the workloads of the compute servers.

In operation 704, the workload information is transmitted to an RMC and the RMC examines the workload to determine whether the current pump speed matches the estimated workload. In other words, the RMC determines whether the liquid flow rate generated based on the current pump speed is sufficient to cool down the heat generated by the estimated workload of the processors. If there is a need to modify the pump speed of the liquid pump, in operation 705, processing logic instructs the pump controller to modify the speed of the liquid pump based on the estimated workload. After the pump speed of the liquid pump has been adjusted or if there is no need to adjust the liquid flow rate, in operation 706, the tasks associated with the workload are then distributed to compute servers. Thus, the liquid follow rate is adjusted prior to the actual task distribution to ensure that there is adequate cooling liquid flowing before the operating temperature rises.

In operation 707, processing logic receives temperature information from each of the compute servers representing an operating temperature of the corresponding compute server. In operation 708, processing logic determine whether there is a need to adjust the pump speed of the liquid pump based on the temperature. In one embodiment, processing logic selects the highest temperature amongst the temperatures collected from all of the compute servers and compares the highest temperature against certain thresholds. If the highest temperature is above a first predetermined threshold or alternatively below a second predetermined threshold, in operation 709, the speed of the liquid pump is adjusted. For example, if the temperature is above the first predetermined threshold, the speed of the liquid pump may be increased. If the temperature is below the second predetermined threshold, the speed of the liquid pump may be decreased, for example, to reduce the energy consumed by the liquid pump. In operation 710, processing logic determines whether there is a new workload to be distributed and if so, the above described operations may be repeated performed.

Note that the heat removal techniques described above can be applied to a variety of different types of data centers, such as, for example, traditional colocation data centers and greenfield data centers. A colocation data center is a type of data center where equipment, space, and bandwidth are available for rental to retail customers. Colocation facilities provide space, power, cooling, and physical security for the server, storage, and networking equipment of other firms, and connect them to a variety of telecommunications and network service providers with a minimum of cost and complexity. A greenfield data center refers to a data center that is built and configured in a location where none exists before. The techniques described above can also be applied to or work in conjunction with a performance optimized data center (POD), or portable on-demand or container data center, where racks of servers are housed in one or more individual containers, modular rooms, or modular housings.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack, comprising:
    a heat removal liquid manifold to provide heat removal liquid;
    a plurality of server blades contained in a plurality of server slots respectively, each server blade including an information technology (IT) component representing a server therein, wherein each of the server blades is coupled to the heat removal liquid manifold to receive cooler liquid from the heat removal liquid manifold to remove heat generated by the IT component and to transmit warmer liquid carrying the heat exchanged from the IT component back to the heat removal liquid manifold;
    a workload calculation module coupled to the server blades to receive workload information from the server blades, wherein the workload calculation module is configured to calculate a total workload of the sever blades;
    a coolant distribution unit (CDU) coupled to the heat removal liquid manifold and the server blades, wherein the CDU is to control a liquid flow rate of the heat removal liquid supplied to the heat removal liquid manifold, wherein the CDU includes
        a heat exchanger to exchange heat carried by the warmer liquid with an external cooler liquid supplied by an external heat removal system,
        a liquid pump to pump the external cooler liquid into the heat removal liquid manifold, and
        a pump controller coupled to control the liquid pump to control the liquid flow rate; and
    a rack management controller (RMC) coupled to each of the server blades and the workload calculation module, wherein the RMC is configured to control the pump controller of the CDU based on the total workload in response to a signal representing the total workload received from the workload calculation module.

2. The electronic rack of claim 1, wherein the RMC is further configured to receive temperature information from each of the server blades representing operating temperatures of the server blades, and wherein the RMC is further configured to control the liquid pump to adjust the liquid flow rate based on the operating temperatures of the server blades.

3. The electronic rack of claim 1, wherein each server blade includes a host node having one or more central processing units (CPUs) and one or more compute nodes, each compute node having one or more general processing units (GPUs), and wherein the host node distributes tasks to be performed by the compute nodes.

4. The electronic rack of claim 3, wherein the host node estimates a workload of the compute nodes based on the tasks to be distributed and transmits the workload information to the workload calculation module prior to distributing the tasks to the compute nodes, such that the pump controller can control the liquid pump based on the workload to adjust the liquid flow rate prior to the compute nodes performing the tasks.

5. The electronic rack of claim 3, wherein each of the compute nodes is coupled to the RMC to provide temperature information to the RMC.

6. A data center system, comprising:
a plurality of electronic racks, wherein each of the electronic racks comprises:
a heat removal liquid manifold to provide heat removal liquid;
a plurality of server blades contained in a plurality of server slots respectively, each server blade including an information technology (IT) component representing a server therein, wherein each of the server blades is coupled to the heat removal liquid manifold to receive cooler liquid from the heat removal liquid manifold to remove heat generated by the IT component and to transmit warmer liquid carrying the heat exchanged from the IT component back to the heat removal liquid manifold;
a workload calculation module coupled to the server blades to receive workload information from the server blades, wherein the workload calculation module is configured to calculate a total workload of the sever blades;
a coolant distribution unit (CDU) coupled to the heat removal liquid manifold and the server blades, wherein the CDU is to control a liquid flow rate of the heat removal liquid supplied to the heat removal liquid manifold, wherein the CDU includes
a heat exchanger to exchange heat carried by the warmer liquid with an external cooler liquid supplied by an external heat removal system,
a liquid pump to pump the external cooler liquid into the heat removal liquid manifold, and
a pump controller coupled to the liquid pump to control the liquid flow rate; and
a rack management controller (RMC) coupled to each of the server blades and the workload calculation module, wherein the RMC is configured to control the pump controller of the CDU based on the total workload in response to a signal representing the total workload received from the workload calculation module.

7. The data center system of claim 6, wherein the RMC is further configured to receive temperature information from each of the server blades representing operating temperatures of the server blades, and wherein the RMC is further configured to control the liquid pump to adjust the liquid flow rate based on the operating temperatures of the server blades.

8. The data center system of claim 6, wherein each server blade includes a host node having one or more central processing units (CPUs) and one or more compute nodes, each compute node having one or more general processing units (GPUs), and wherein the host node distributes tasks to be performed by the compute nodes.

9. The data center system of claim 8, wherein the host node estimates a workload of the compute nodes based on the tasks to be distributed and transmits the workload information to the workload calculation module prior to distributing the tasks to the compute nodes, such that the pump controller can control the liquid pump based on the workload to adjust the liquid flow rate prior to the compute nodes performing the tasks.

10. The data center system of claim 8, wherein each of the compute nodes is coupled to the RMC to provide temperature information to the RMC.

11. A machine-implemented method for removing heat from electronic racks, the method comprising:
receiving, by a workload calculation module coupled to a plurality of server blades of an electronic rack, workload information of information technology (IT) components of the server blades, each server blade representing a server contained in one of a plurality of server slots of the electronic rack;
calculating by the workload calculation module a total workload of the sever blades based on the workload information;
controlling a coolant distribution unit (CDU) by a rack management controller (RMC) coupled to the server blades and the workload calculation module, in response to a signal representing the total workload received from the workload calculation module;
receiving, by the CDU, data representing the total workload of the server blades, wherein the CDU comprises a heat exchanger to exchange heat with an external cooler liquid supplied by an external heat removal system, a liquid pump, and a pump controller coupled to the liquid pump;
controlling by the CDU a liquid flow rate of a heat removal liquid supplied to a heat removal liquid manifold of the electronic rack based on the total workload of the IT components of the server blades;
removing at least a portion of heat generated by the IT components using the heat removal liquid, wherein each of the server blades is coupled to the heat removal liquid manifold to receive cooler liquid from the heat removal liquid manifold, to remove at least a portion of heat generated by the corresponding IT component using the cooler liquid, and to transmit warmer liquid carrying the heat exchanged from the IT component back to the heat removal liquid manifold.

12. The method of claim 11, wherein the RMC is further configured to receive temperature information from each of the server blades representing operating temperatures of the server blades, and wherein the RMC is further configured to control the liquid pump to adjust the liquid flow rate based on the operating temperatures of the server blades.

13. The method of claim 11, wherein each server blade includes a host node having one or more central processing units (CPUs) and one or more compute nodes, each compute node having one or more general processing units (GPUs), and wherein the host node distributes tasks to be performed by the compute nodes.

14. The method of claim 13, wherein the host node estimates a workload of the compute nodes based on the tasks to be distributed and transmits the workload information to the workload calculation module prior to distributing the tasks to the compute nodes, such that the pump controller can control the liquid pump based on the workload to adjust the liquid flow rate prior to the compute nodes performing the tasks.

15. The method of claim 13, wherein each of the compute nodes is coupled to the RMC to provide temperature information to the RMC.

* * * * *